(12) United States Patent
Chilcott

(10) Patent No.: US 7,160,751 B2
(45) Date of Patent: Jan. 9, 2007

(54) METHOD OF MAKING A SOI SILICON STRUCTURE

(75) Inventor: Dan W. Chilcott, Greentown, IN (US)

(73) Assignee: Delphi Technologies, Inc., Troy, MI (US)

( * ) Notice: Subject to any disclaimer, the term of this patent is extended or adjusted under 35 U.S.C. 154(b) by 39 days.

(21) Appl. No.: 11/151,680

(22) Filed: Jun. 13, 2005

(65) Prior Publication Data

US 2006/0281214 A1    Dec. 14, 2006

(51) Int. Cl.
*H01L 21/00* (2006.01)
(52) U.S. Cl. .................. 438/52; 438/53; 438/E29.324; 438/704; 257/419
(58) Field of Classification Search ............ 438/50, 438/52, 53, 704, 712, 736, 737, 739, 756, 438/757; 257/419
See application file for complete search history.

(56) References Cited

U.S. PATENT DOCUMENTS

| | | |
|---|---|---|
| 6,815,243 B1 | 11/2004 | Lucak et al. |
| 6,841,861 B1 | 1/2005 | Brady |
| 6,916,728 B1 * | 7/2005 | Gogoi et al. .............. 438/481 |

* cited by examiner

*Primary Examiner*—Quoc Hoang
(74) *Attorney, Agent, or Firm*—Jimmy L. Funke

(57) ABSTRACT

A process for making a microelectromechanical device having a moveable component defined by a gap pattern in a semiconductor layer of a silicon-on-insulator wafer involves the use of a plurality of deep reactive ion etching steps at various etch depths that are used to allow a buried oxide layer of the silicon-on-insulator wafer to be exposed in selected areas before the entire moveable component of the resulting device is freed for movement. This method allows wet release techniques to be used to remove the buried oxide layer without developing stiction problems. This is achieved by utilizing deep reactive ion etching to free the moveable component after a selected portion of the buried oxide layer has been removed by wet etching.

1 Claim, 1 Drawing Sheet

METHOD OF MAKING A SOI SILICON STRUCTURE

FIELD OF THE INVENTION

This invention relates to a method of making a microelectromechanical system (MEMS) having a moveable component defined by a gap pattern in the semiconductor layer of a silicon-on-insulator (SOI) wafer.

BACKGROUND OF THE INVENTION

Microelectromechanical systems (MEMS) are being utilized in a variety of micro-sensor applications, with specific applications including accelerometers having a component that is moveable with respect to the main body or substrate of the device when subjected to acceleration, whereby a resulting change in a capacitive gap is used to generate an electrical output that can be correlated to the magnitude and/or direction of the acceleration. The MEMS device should be fabricated to form a functional element in a semiconductor wafer having an overall structure of small dimensions.

MEMS fabrication processes commonly use a release technique to free the moveable component of the MEMS structure from the substrate or underlying films to allow the structure to freely move. The most common release method is to remove an oxide film from under a poly-silicon or silicon device layer using a wet etch technique. The use of a wet etch leads to stiction, which occurs when the moveable component contacts another surface of the device and becomes permanently or temporarily bonded to the other surface.

Attempts to overcome the stiction problem associated with the use of wet etching have involved methods for removing the liquid etchant by alcohol displacement and subsequent evaporation. These techniques require additional steps, time and equipment, and therefore add significantly to the overall manufacturing cost.

Recently, MEMS devices have been produced using deep reactive ion etching (DRIE) of silicon-on-insulator (SOI) wafers. This technique is used to remove material from the silicon device layer until the buried oxide layer is reached. The buried oxide layer is then removed with a wet etch technique or with vapor phase hydrofluoric acid (HF) etching. The wet etch technique results in stiction. The HF vapor process eliminates stiction but attacks most common semiconductor films.

SUMMARY OF THE INVENTION

In this invention, a plurality of DRIE etching steps at different depths are used to allow a buried oxide layer of an SOI wafer to be exposed in selected areas before the entire moveable component of a resulting MEMS device is freed for movement. This method allows a wet release technique to be used to remove the buried oxide layer without developing stiction problems, since the structure that will eventually constitute the moveable component remains rigidly connected (i.e., remains immoveable) during the wet etching step. An additional DRIE etching step is used after the wet etching step to free the moveable component via a dry process.

These and other features, advantages and objects of the present invention will be further understood and appreciated by those skilled in the art by reference to the following specification, claims and appended drawings.

DETAILED DESCRIPTION OF PREFERRED EMBODIMENT

Figure 1:
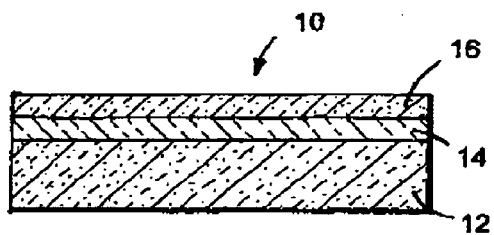
FIG. 1 is a schematic cross section of an SOI wafer suitable for use in preparing a MEMS structure in accordance with the methods of the invention.
Figure 5:
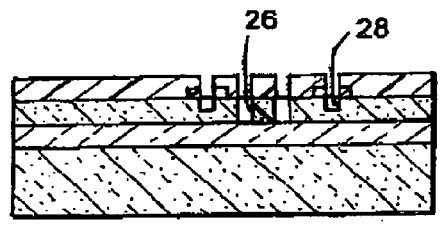
FIGS. 2–7 show intermediate structures developed during a process in accordance with the invention.

Shown in FIG. 1 is a silicon-on-insulator (SOI) wafer 10 from which a MEMS device can be fabricated employing the methods of the invention. SOI wafer 10 is a layered device including a substrate or base layer 12, which may be either electrically conductive or non-conductive. Suitable materials for base layer 12 include silicon, crystalline sapphire, crystalline silicon, polycrystalline silicon, silicon carbide, alumina, alumina nitride, and gallium, arsenide. For accelerometer devices, it is usually desirable that the base layer 12 is silicon. This ensures that the thermal and mechanical properties of base layer 12 and the MEMS structure fabricated from the other layers of the SOI are sufficiently similar to make processing easier and eliminate the possibility of undesirable thermally induced stresses, either during fabrication or use of the device.

Immediately adjacent base layer 12 is an electrically non-conductive or insulative layer 14. Layer 14 is typically silicon dioxide or silicon nitride.

Adjacent insulator layer 14 is an electrically semi-conductive layer 16, such as a phosphorus-doped or arsenic-doped silicon layer of material.

SOI wafers are well known in the art of fabricating MEMS structures, and are commercially available from several different sources. Layer 16 is typically formed by bonding a substrate to layer 14 followed by grinding, capping, or polishing to control the thickness. Layer 14 is typically prepared by thermal oxidation, chemical vapor deposition (CVD), physical vapor deposition (PVD), plasma enhanced physical vapor deposition (PEPVD), or other well known techniques. The thickness of layers 12, 14 and 16 are not especially critical. Typically, the thickness of layer 12 is from about 350 to 750 microns. The typical thickness for layer 14 is 1–3 µm, and the typical thickness for layer 16 is 1–100 µm.

Figure 2:
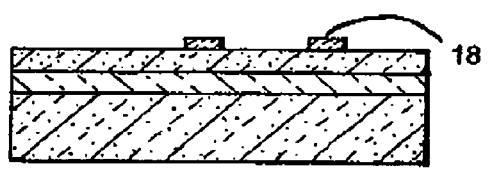
Figure 6:
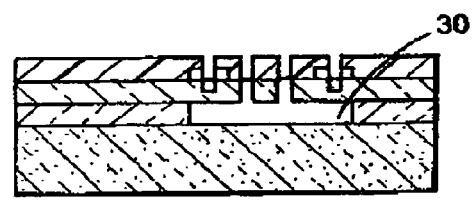

In a first step of a process in accordance with the invention, an etch inhibiting material 18 (FIG. 2) is deposited on the exposed surface of layer 16 in a desired pattern generally corresponding with a separation pattern that defines a moveable component of a MEMS structure. Etched inhibiting material 18 is any suitable material that will resist DRIE. Suitable DRIE inhibiting materials 18 include thin film oxides or nitrides such as silicon dioxide, which can be deposited on selected exposed surfaces of layer 16 in a desired pattern using PVD, CVD, PEPVD or other suitable techniques.

Next, a photoresist mask 20, which defines the shape of the moving component of the MEMS structure is patterned onto layer 16. Suitable photoresist materials that can be patterned onto a surface of layer 16 are well known in the art and commercially available. Similarly, suitable techniques of depositing a photoresist mask in a desired pattern on a surface are well known in the art and do not, of themselves, constitute a novel feature of the invention.

Figure 3:
Figure 7:
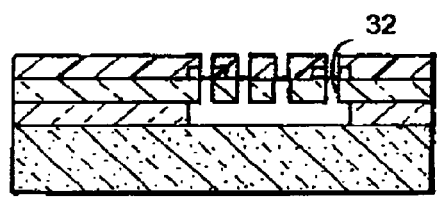

As can be seen in FIG. 3, photoresist mask 20 exposes DRIE inhibiting material 18 at strategically selected locations, and also exposes layer 16 at selected location overlying a portion of layer 14 that will be subsequently removed by wet etching to form a hollow chamber over which the moveable component will be supported.

DRIE is used to partially etch through the SOI device layer 16 to form slots or holes 22. However, there is not any etching that takes place where DRIE inhibiting material 18 is located.

Figure 4:

After slots or holes 22 have been formed, an etch process (e.g., HF etching) is used for removing exposed DRIE inhibiting material 18 and exposing the underlying layer 16 as shown in FIG. 4. Suitable etchants are those that will etch material 18 (typically silicon dioxide), but will not appreciably etch layer 16 (typically silicon). The resulting intermediate structure of FIG. 4 includes at least one hole or slot 22 etched partially through layer 16, and a photoresist mask 20 exposing slot or hole 22 and selected surfaces of layer 16 for a subsequent DRIE step.

Upon further DRIE, slots or holes 22 are extended through layer 16 to form deep slots or holes 26 exposing insulator layer 14. At the same time, grooves 28 are partially etched through layer 16.

With slots or holes 26 exposing the surface of insulator layer 14 (e.g., metal oxide or metal nitride), a wet etch process is used to remove buried material from under semi-conductor layer 16 to form a hollow chamber 30. Suitable wet etchants include hydrofluoric acid and/or other liquids that can be used for etching insulation layer 14, but which do not appreciably etch layers 12 or 16.

After the wet etch of layer 14 has been completed, and the etchant has been removed, a third DRIE step is performed to remove the remaining silicon under groove pattern 28, and create a separation or gap pattern 32 that defines the moveable component of a resulting MEMS structure.

Figure 8:
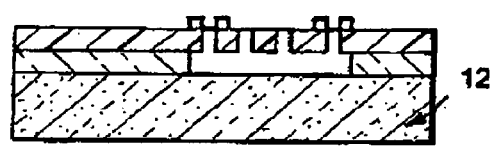
FIG. 8 shows a completed MEMS structure using a method in accordance with the invention.

A conventional stripping material suitable for etching or otherwise removing photoresist material 20 can be employed to provide a finished device as shown in FIG. 8, in which the separation pattern 32 is completely defined by a dry etching process that is not susceptible to stiction problems normally associated with wet etching techniques.

The above description is considered that of the preferred embodiments only. Modifications of the invention will occur to those skilled in the art and to those who make or use the invention. Therefore, it is understood that the embodiments shown in the drawings and described above are merely for illustrative purposes and not intended to limit the scope of the invention, which is defined by the following claims as interpreted according to the principles of patent law, including the doctrine of equivalents.

The invention claimed is:

1. A process for making a microelectromechanical system having a moveable component defined by a patterned gap in a semiconductor layer of a silicon-on-insulator wafer, wherein the moveable component is integrally supported by the semiconductor layer above a hollow chamber defined in an insulator layer of the silicon-on-insulator wafer, comprising:

providing a silicon-on-insulator wafer having a semiconductor layer adjacent an insulator layer;

depositing an etch inhibiting material on the semiconductor layer in a desired pattern generally corresponding with a gap pattern that defines a moveable component of the device, the etch inhibiting material being resistant to deep reactive ion etching;

patterning a photoresist mask over the semiconductor layer, the photoresist mask having a pattern that exposes a portion of the etch inhibiting material, and also exposes the semiconductor layer at selected locations overlying a portion of the insulator layer that is to be removed;

deep reactive ion etching to partially etch openings through the semiconductor layer;

wet etching to remove the exposed etch inhibiting material;

deep reactive ion etching to extend the partially etched semiconductor openings through the semiconductor layer and expose the insulator layer, and at the same time partially etch a groove pattern into the semiconductor layer which corresponds with the desired gap pattern defining a moveable component;

wet etching a portion of the insulator layer to develop a hollow chamber underlying the desired moveable component; and deep reactive ion etching to remove the remaining semiconductor material under the groove pattern to develop a gap pattern that defines the moveable component.

* * * * *